United States Patent
Lee et al.

(10) Patent No.: US 8,168,454 B2
(45) Date of Patent: May 1, 2012

(54) VERTICAL LIGHT EMITTING DIODE AND METHOD OF MANUFACTURING THE SAME

(75) Inventors: Su Yeol Lee, Seognam (KR); Sang Ho Yoon, Seongnam (KR); Doo Go Baik, Suwon (KR); Seok Beom Choi, Daejeon (KR); Tae Sung Jang, Suwon (KR); Jong Gun Woo, Suwon (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 115 days.

(21) Appl. No.: 12/466,086

(22) Filed: May 14, 2009

(65) Prior Publication Data

US 2009/0221110 A1  Sep. 3, 2009

Related U.S. Application Data

(62) Division of application No. 11/889,562, filed on Aug. 14, 2007, now Pat. No. 8,115,220.

(30) Foreign Application Priority Data

Oct. 23, 2006 (KR) .................. 10-2006-0102967

(51) Int. Cl.
*H01L 21/00* (2006.01)
(52) U.S. Cl. ...................... 438/22; 372/43.01
(58) Field of Classification Search ........ 438/22
See application file for complete search history.

(56) References Cited

U.S. PATENT DOCUMENTS

| 6,207,469 | B1 | 3/2001 | Ota et al. |
|---|---|---|---|
| 2002/0001864 | A1 | 1/2002 | Ishikawa et al. |
| 2002/0137248 | A1 | 9/2002 | Ogawa et al. |
| 2003/0218179 | A1 | 11/2003 | Koide et al. |
| 2004/0110395 | A1 | 6/2004 | Ueda et al. |
| 2006/0203871 | A1 | 9/2006 | Ueda et al. |
| 2007/0121690 | A1* | 5/2007 | Fujii et al. .............. 372/43.01 |
| 2008/0001165 | A1* | 1/2008 | Hashimoto et al. ........ 257/103 |

FOREIGN PATENT DOCUMENTS

| JP | 09-266218 | 10/1997 |
|---|---|---|
| JP | 11-126758 | 5/1999 |
| JP | 11-238692 | 8/1999 |
| JP | 2003-318443 | 11/2003 |

(Continued)

OTHER PUBLICATIONS

United States Office Action issued in U.S. Appl. No. 11/889,562, mailed Jan. 21, 2010.

(Continued)

*Primary Examiner* — Thao Le
*Assistant Examiner* — Geoffrey Ida
(74) *Attorney, Agent, or Firm* — McDermott Will & Emery LLP

(57) ABSTRACT

Provided is a vertical LED including an n-electrode; an n-type GaN layer formed under the n-electrode, the n-type GaN layer having a surface coming in contact with the n-electrode, the surface having a $Ga^+N$ layer containing a larger amount of Ga than that of N; an active layer formed under the n-type GaN layer; a p-type GaN layer formed under the active layer; a p-electrode formed under the p-type GaN layer; and a structure support layer formed under the p-electrode.

6 Claims, 3 Drawing Sheets

FOREIGN PATENT DOCUMENTS

| | | |
|---|---|---|
| JP | 2003-347587 | 12/2003 |
| JP | 2004-112000 | 4/2004 |
| JP | 2005-183930 | 7/2005 |
| JP | 2006-066556 | 3/2006 |
| JP | 2006-287212 | 10/2006 |

OTHER PUBLICATIONS

Lin, M.E., et al., "Low resistance ohmic contacts on wide band-gap GaN", Applied Physics Letters, Feb. 21, 1994, pp. 1003-1005, vol. 64 No. 8, American Institute of Physics.

Ruvimov, S., et al., "Microstructure of Ti/Al and Ti/Al/Ni/Au Ohmic contacts for *n*-GaN", Applied Physics Letters, Sep. 9, 1996, pp. 1556-1558, vol. 69 No. 11, American Institute of Physics.

Japanese Office Action, with English translation, issued in Japanese Patent Application No. 2007-215092, dated Jun. 29, 2010.

United States Office Action issued in U.S. Appl. No. 11/889,562, mailed Sep. 1, 2010.

Japanese Office Action, with English translation, issued in Japanese Patent Application No. 2006-215092, mailed Oct. 29, 2010.

United States Office Action issued in U.S. Appl. No. 11/889,562, mailed on Feb. 9, 2011.

\* cited by examiner

[FIG. 1]
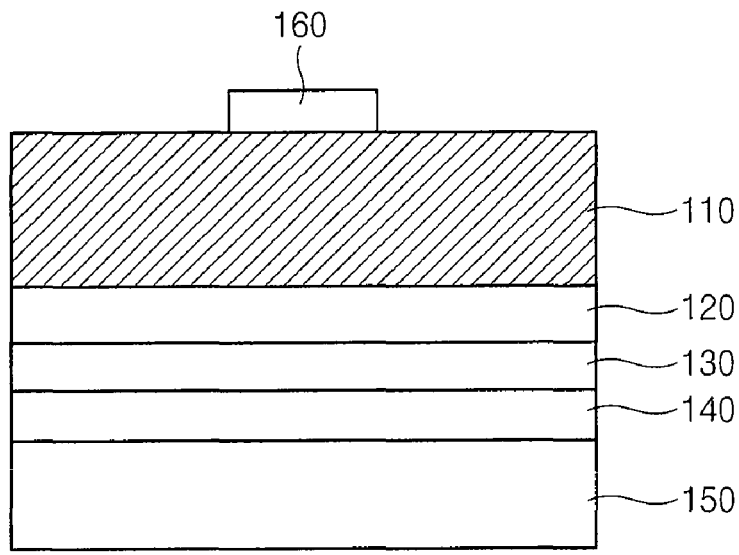
[FIG. 2]
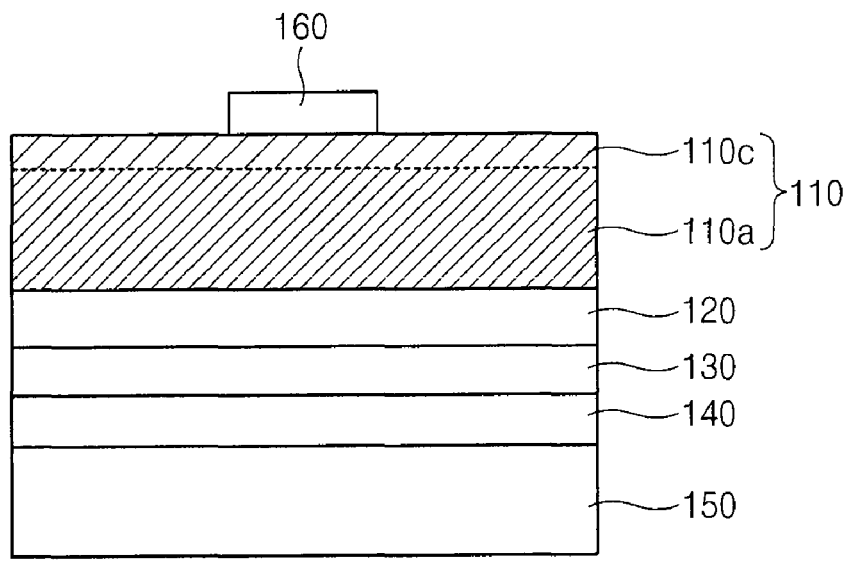
[FIG. 3A]
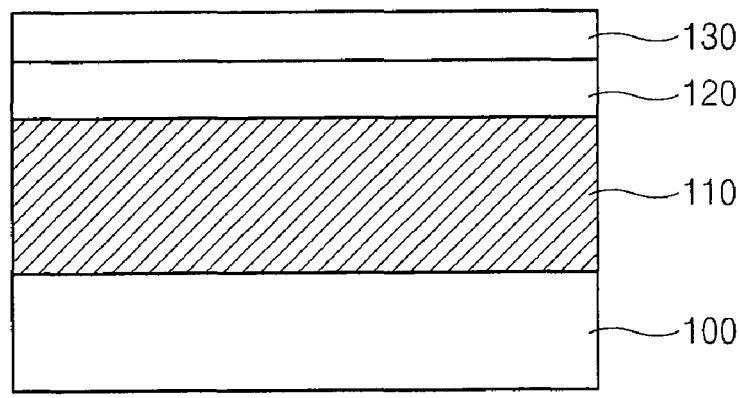

[FIG. 3B]
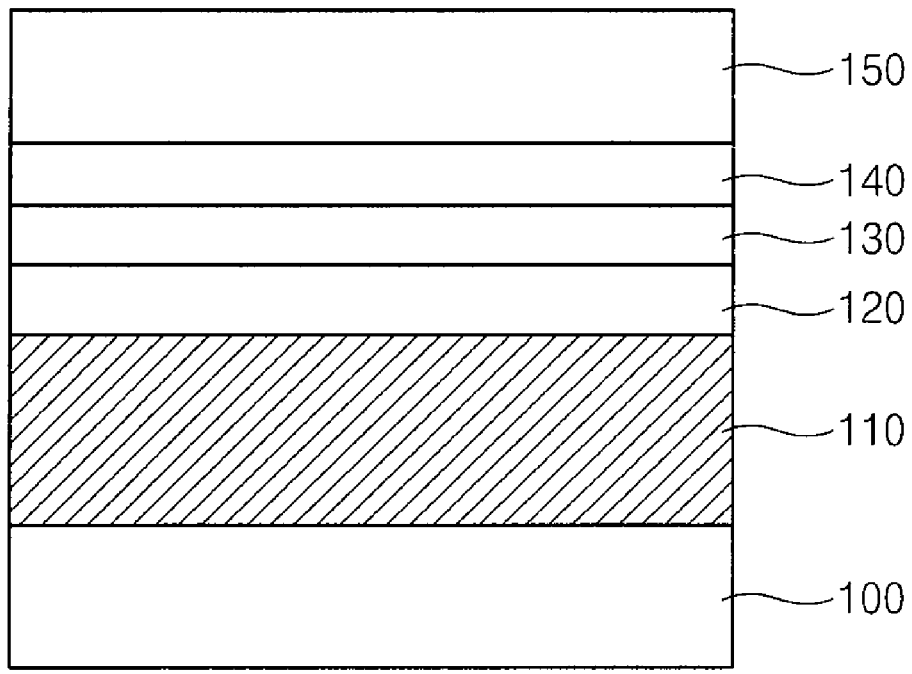
[FIG. 3C]
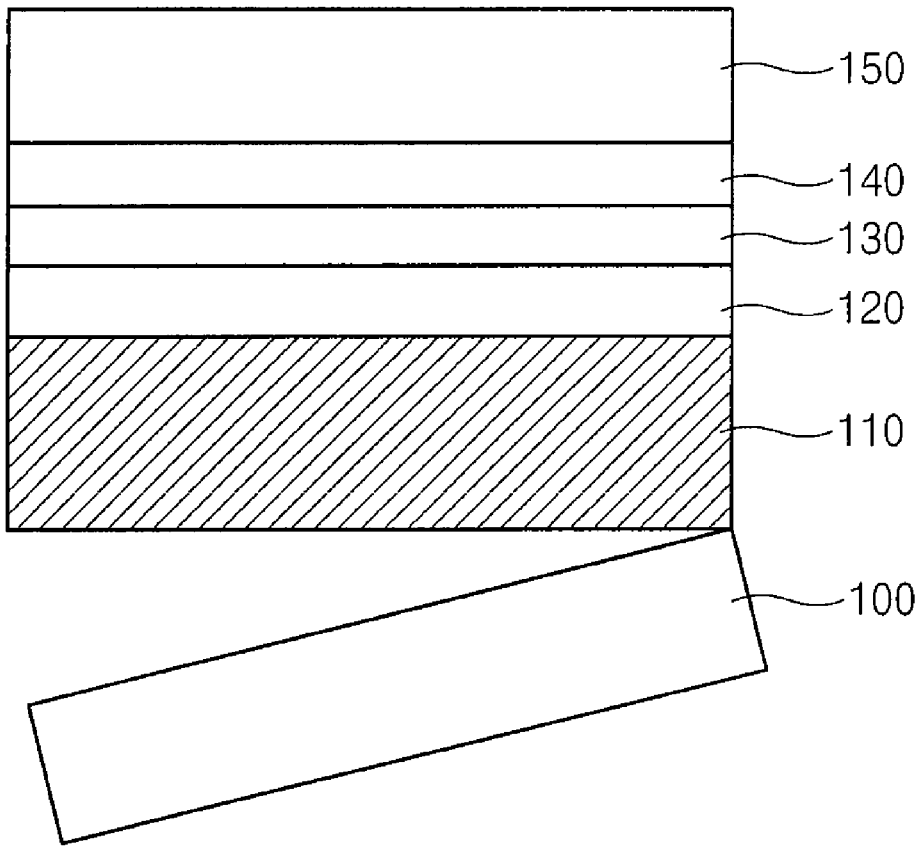

[FIG. 3D]
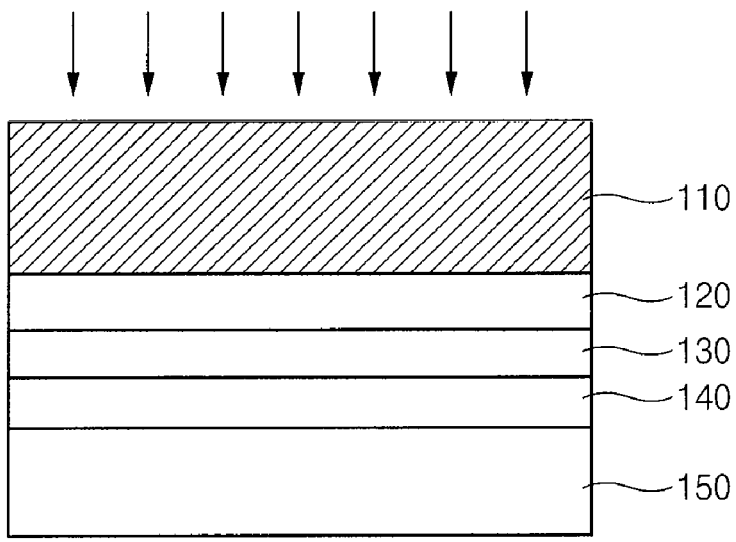
[FIG. 3E]
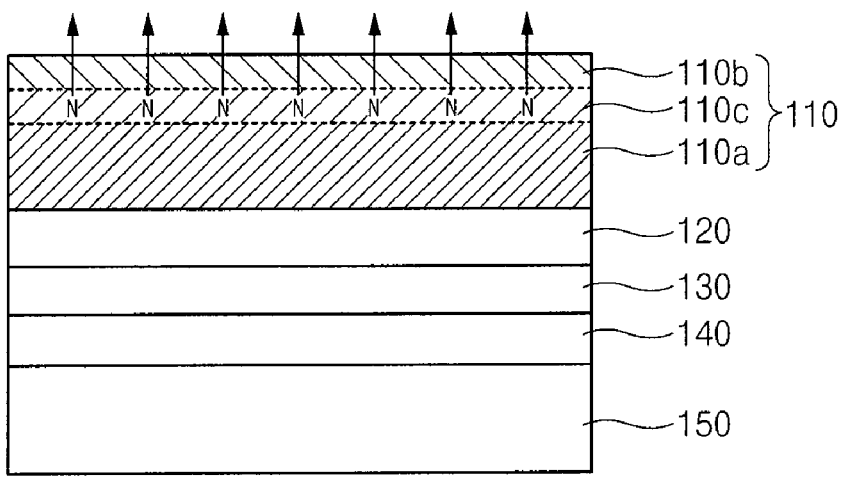
[FIG. 3F]
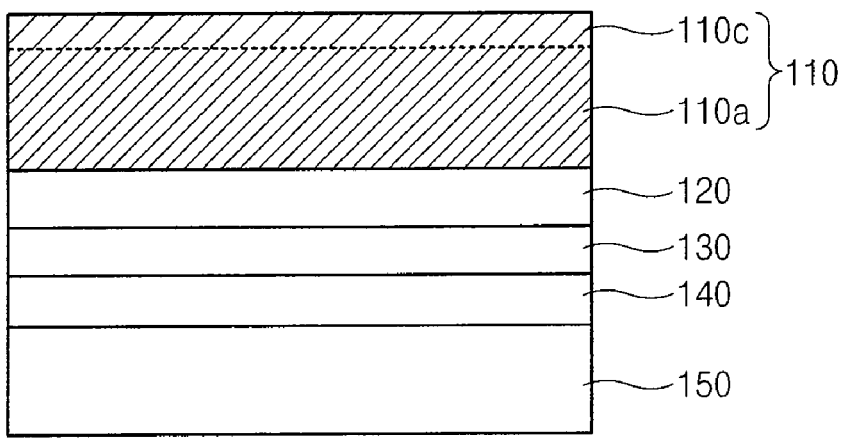

VERTICAL LIGHT EMITTING DIODE AND METHOD OF MANUFACTURING THE SAME

CROSS-REFERENCE TO RELATED APPLICATIONS

This application is a Divisional of U.S. application Ser. No. 11/889,562, filed Aug. 14, 2007 now U.S. Pat. No. 8,115,220, and claims the benefit of Korean Patent Application No. 10-2006-0102967 filed with the Korean Intellectual Property Office on Oct. 23, 2006, the entire disclosures of each of which are incorporated herein by reference.

BACKGROUND OF THE INVENTION

1. Field of the Invention

The present invention relates to a vertical light emitting diode (LED) and a method of manufacturing the same, which can reduce contact resistance of an negative electrode formed on the surface of an n-type GaN layer and can enhance thermal stability.

2. Description of the Related Art

Generally, a nitride-based semiconductor LED is grown on a sapphire substrate, but the sapphire substrate is a rigid nonconductor and has poor thermal conductivity. Therefore, there is a limitation in reducing the manufacturing costs by reducing the size of a nitride-based semiconductor LED, or improving the optical power and chip characteristic. Particularly, because the application of a high current is essential for achieving high power LED, it is important to solve a heat-sink problem of the LED. To solve this problem, there has been proposed a vertical LED in which a sapphire substrate is removed using Laser Lift-Off (LLO).

Hereinafter, a conventional vertical LED will be described in detail with reference to FIG. 1. FIG. 1 is a cross-sectional view of a conventional vertical LED.

As shown in FIG. 1, the conventional vertical LED has a structure support layer 150 formed in the lowermost portion and a positive (p-) electrode 140 formed on the structure support layer 150. Preferably, the p-electrode 140 is formed of a conductive reflecting member serving as an electrode and a reflecting layer.

On the p-electrode 140, a p-type GaN layer 130, an active layer 120, and an n-type GaN layer 110 are sequentially formed, thereby forming a light emission structure.

An upper portion of the light emission structure, that is, the surface of the n-type GaN layer 110 has surface irregularities (not shown) for enhancing light emission efficiency. On the n-type GaN layer 110, a negative (n-) electrode 160 is formed.

In the conventional vertical LED, however, the surface of the n-type GaN layer 110 coming in contact with the n-electrode 160 is an N-face or N-polar surface which comes in contact with a sapphire substrate (not shown) on which the n-type GaN layer is formed.

When the n-electrode 160 is positioned on the n-type GaN layer 110 having an N-face or N-polar surface, the contact resistance of the n-electrode increases, and thus an operational voltage of the LED increases. As a result, a heating value increases.

As such, when a heating value increases so that the thermal stability of the vertical LED decreases, the contact resistance of the LED also continuously increases, thereby degrading characteristics and reliability of the vertical LED.

SUMMARY OF THE INVENTION

An advantage of the present invention is that it provides a vertical LED in which the surface of an n-type GaN layer coming in contact with an n-electrode is formed of a $Ga^+N$ layer containing a larger amount of Ga than that of N, that is, the surface electron concentration of the n-type GaN layer is increased. In the vertical LED, the contact resistance of the n-type GaN layer coming in contact with the n-electrode and having an N-face or N-polar surface can be reduced, and thermal stability can be enhanced.

Another advantage of the invention is that is provides a method of manufacturing the vertical LED.

Additional aspect and advantages of the present general inventive concept will be set forth in part in the description which follows and, in part, will be obvious from the description, or may be learned by practice of the general inventive concept.

According to an aspect of the invention, a vertical LED comprises an n-electrode; an n-type GaN layer formed under the n-electrode, the n-type GaN layer having a surface coming in contact with the n-electrode, the surface having a $Ga^+N$ layer containing a larger amount of Ga than that of N; an active layer formed under the n-type GaN layer; a p-type GaN layer formed under the active layer; a p-electrode formed under the p-type GaN layer; and a structure support layer formed under the p-electrode.

The n-electrode may be formed of a single layer composed of one or more metals selected from the group consisting of Ti, Ta, and Zr. Alternately, the n-electrode may be formed of a multilayer in which more than two layers including a layer composed of one or more metals selected from the group consisting of Ti, Ta, and Zr are laminated.

The $Ga^+N$ layer of the n-type GaN layer may be formed by laser-treating or heat-treating the surface of the n-type GaN layer coming in contact with the n-electrode.

The p-electrode may be formed of a conductive reflecting member. Further, the $Ga^+N$ layer coming in contact with the n-electrode may have surface irregularities formed thereon.

According to another aspect of the invention, a method of manufacturing a vertical LED comprises forming a light emission structure in which an n-type GaN layer, an active layer, and a p-type GaN layer are sequentially laminated on a substrate; forming a p-electrode on the light emission structure; forming a structure support layer on the p-electrode; removing the substrate to expose the n-type GaN layer; laser-treating the surface of the exposed n-type GaN layer to form a Ga layer and a $Ga^+N$ layer which are sequentially laminated from the laser-treated surface; and forming an n-electrode on the laser-treated surface of the n-type GaN layer.

Preferably, the laser-treatment is performed using laser with a wavelength having energy larger than an energy band gap of GaN.

Preferably, the method further comprises forming surface irregularities on the laser-treated surface of the n-type GaN layer, before the forming of the n-electrode.

According to a further aspect of the invention, a method of manufacturing a vertical LED comprises forming a light emission structure in which an n-type GaN layer, an active layer, and a p-type GaN layer are sequentially laminated on a substrate; forming a p-electrode on the light emission structure; forming a structure support layer on the p-electrode; removing the substrate to expose the n-type GaN layer; heat-treating the surface of the exposed n-type GaN layer to form a Ga layer and a $Ga^+N$ layer which are sequentially laminated from the heat-treated surface; and forming an n-electrode on the heat-treated surface of the n-type GaN layer.

Preferably, the heat-treatment is performed at a temperature of more than 500° C.

Preferably, the method further comprises forming surface irregularities on the laser-treated surface of the n-type GaN layer, before the forming of the n-electrode.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional vertical LED;

FIG. 2 is a cross-sectional view of a vertical LED according to an embodiment of the invention; and FIGS. 3A to 3F are sectional views sequentially showing a process for explaining a method of manufacturing a vertical LED according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, preferred embodiments of the present invention will be described in detail with reference to the accompanying drawings.

Structure of Vertical LED

Referring to FIG. 2, the structure of a vertical LED according to an embodiment of the invention will be described in detail.

FIG. 2 is a cross-sectional view of a vertical LED according to an embodiment of the invention.

As shown in FIG. 2, the vertical LED has an n-electrode 160 formed in the uppermost portion thereof. Preferably, the n-electrode 160 is formed of a single layer composed of one or more metals selected from the group consisting of Ti, Ta, and Zr forming a nitride or a multilayer in which more than two layers including a layer composed of one or more metals selected from the group consisting of Ti, Ta, and Zr are laminated, in order to increase the electron concentration of a $Ga^+N$ layer which will be described below. As for the multilayer, Ti/Al/Ti/Au or Ti/Al, Ta/Al/Ti/Au, Ti/Au, TiTa/Au and the like are exemplified.

Under the n-electrode 160, an n-type GaN layer 110 is formed.

In a general vertical LED, the n-type GaN layer 110 is formed on a sapphire substrate by an epitaxial growth method, and the sapphire substrate is then removed. Therefore, the surface of the n-type GaN layer 110, which comes in contact with the n-electrode 160, is an N-face or N-polar surface.

However, when the n-electrode 160 is positioned on the n-type GaN layer 110 having an N-face or N-polar surface, the contact resistance of the n-electrode 160 increases as in the related art. Therefore, an operational voltage of an LED is increased so that a heating value increases.

To solve such a problem, the surface of the n-type GaN layer 110 coming in contact with the n-electrode 160 is formed of a $Ga^+N$ layer 110c containing a larger amount of Ga than that of N. That is, the $Ga^+N$ layer 110c serves to increase the electron concentration of the surface of the n-type GaN layer 110 coming in contact with the n-electrode 160.

In other words, the n-type GaN layer 110 has such a structure that the $Ga^+N$ 110c containing a larger amount of Ga than that of N and a GaN layer 110a are sequentially laminated under the n-electrode 160. The $Ga^+N$ layer 110c is formed by the following process. The surface of the GaN layer 110a adjacent to the n-electrode 160 is laser- or heat-treated so that GaN is separated into Ga and N elements. Then, the $Ga^+N$ layer 100c is formed.

As described above, when the surface of the n-type GaN layer 110 coming in contact with the n-electrode 160 is formed of the $Ga^+N$ 110c having high electron concentration, a Schottky barrier height is reduced, thereby reducing contact resistance. As a result, it is possible to enhance thermal stability of the vertical LED.

Meanwhile, although not shown, the surface of the n-type GaN layer 110 coming in contact with the n-electrode 160, that is, the surface of the $Ga^+N$ layer 110c is preferably formed with surface irregularities for increasing light extraction efficiency.

Under the n-type GaN layer 110, an active layer 120 and a p-type GaN layer 130 are sequentially laminated, thereby forming an LED light emission structure.

In the LED light emission structure, the p-type GaN layer 130 may be a GaN layer or GaN/AlGaN layer doped with p-type impurities, and the active layer 120 may be formed with a multi-quantum well structure composed of an InGaN/GaN layer.

Under the p-type GaN layer 130 of the LED light emission structure, a p-electrode 140 is formed. Preferably, the p-electrode 40 serves as an electrode and a reflecting layer. Accordingly, the p-electrode 40 is formed of a conductive reflecting member.

Although not shown, a p-electrode and a reflecting layer may be sequentially laminated under the p-type GaN layer 130.

Under the p-electrode 140, a structure support layer 150 is bonded through a conductive bonding layer (not shown). The structure support layer 150 serves as a support layer of a finalized LED and an electrode and is formed of a Si substrate, a GaAs substrate, a Ge substrate, or a metal layer. The metal layer can be formed by electroplating, electroless plating, thermal evaporating, e-beam evaporating, sputtering, Chemical Vapor Deposition (CVD) or the like.

Method of Manufacturing Vertical LED

Referring to FIGS. 3A to 3F and 2, a method of manufacturing a vertical LED according to an embodiment of the invention will be described in detail.

FIGS. 3A to 3F are sectional views sequentially showing a process for explaining a method of manufacturing a vertical LED according to an embodiment of the invention.

First, as shown in FIG. 3A, an LED light emission structure, in which an n-type GaN layer 110, a GaN/InGaN active layer 120 with a multi-quantum well structure, and a p-type GaN layer 130 are sequentially laminated, is formed on a substrate 100.

Preferably, the substrate 100 having the LED light emission structure formed thereon is formed of a transparent material including sapphire. In addition to sapphire, the substrate 100 may be formed of zinc oxide (ZnO), gallium nitride (GaN), silicon carbide (SiC) or aluminum nitride (AlN).

The n-type GaN layer 110, the active layer 120, and the p-type GaN layer 130 may be formed by a known nitride deposition process such as Metal-Organic Chemical Vapor Deposition (MOCVD) or the like.

The active layer 120 may be formed of one quantum-well layer or may be formed with a double-hetero structure.

Next, as shown in FIG. 3B, a p-electrode 140 and a structure support layer 150 are sequentially formed on the LED light emission structure, that is, on the p-type GaN layer 130.

Preferably, the p-electrode 140 is formed of a conductive reflecting member such that light generated from the active layer 120 is prevented from being absorbed into the structure support layer 150.

The structure support layer 150 serves as a support layer and an electrode of a finalized LED and is formed of a Si substrate, a GaAs substrate, a Ge substrate, or a metal layer. The metal layer can be formed by electroplating, electroless plating, thermal evaporating, e-beam evaporating, sputtering, CVD or the like.

Subsequently, as shown in FIG. 3C, the substrate 100 is separated from the LED light emission structure, that is, the n-type GaN layer 110 such that the n-type GaN layer 110 is exposed.

At this time, the substrate 100 is removed using a Laser Lift-Off (LLO) method, a Chemical Lift-Off (CLO) method, a Chemical Mechanical Polishing (CMP) method or the like.

Then, as shown in FIG. 3D, the surface of the exposed n-type GaN layer 110 is laser- or heat-treated by a predetermined thickness in a direction of the arrow. At this time, only the surface of the n-type GaN layer 110 is modified by the predetermined thickness. Preferably, the modified surface has a thickness of less than several hundreds nm.

Preferably, the laser treatment is performed using laser with a wavelength having energy larger than an energy band gap (3.3 eV) of GaN. More specifically, 248 nm KrF laser (5 eV) or 193 nm ArF laser (6.4 eV) is used.

Further, the heat treatment is performed at a temperature of more than 500° C. such that GaN forming the N-type GaN layer 110 can be separated into Ga and N elements.

Then, as shown in FIG. 3E, the n-type GaN layer 110 has such a structure that a Ga layer 110b, a Ga$^+$N layer 110c, and a GaN layer 110a are sequentially laminated from the surface of the n-type GaN layer 110 coming in contact with the n-electrode 160. At this time, while the separated N elements pass through the Ga layer 110b so as to be evaporated, the Ga$^+$N layer 110c has an N-vacancy structure. That is, the Ga$^+$N layer 110c is a portion of the n-type GaN layer 110, where electron concentration has increased.

Next, as shown in FIG. 3F, the Ga layer 110b is removed using a chemical solution such as HCl or the like. In this case, the removing of the Ga layer 110b is not necessarily performed. The reason why the removing is performed is for improving adhesive strength with an n-electrode which will be described below.

After that, an n-electrode 160 is formed on the Ga$^+$N layer 110c exposed by removing the GaN layer 110b (refer to FIG. 2).

Preferably, the n-electrode 160 is formed of a single layer composed of one or more metals selected from the group consisting of Ti, Ta, and Zr forming a nitride or a multilayer in which more than two layers including a layer composed of one or more metals selected from the group consisting of Ti, Ta, and Zr are laminated, in order to increase the electron concentration of the Ga$^+$N layer positioned under the n-electrode 110c. As for the multilayer, Ti/Al/Ti/Au or Ti/Al, Ta/Al/Ti/Au, Ti/Au, TiTa/Au and the like are exemplified.

According to the vertical LED of the invention, the surface of the n-type GaN layer coming in contact with the n-electrode is formed of a Ga$^+$N layer, containing a larger amount of Ga than that of N, such that the surface electron concentration of the n-type GaN layer is increased. Therefore, when the n-electrode comes in contact with the n-type GaN layer having an N-face or N-polar surface, the Schottky barrier height is reduced so that contact resistance can be reduced.

Further, when the contact resistance of the n-electrode is reduced, an operational voltage of the LED decreases so that a heating value decreases. Therefore, it is possible to enhance thermal stability of the vertical LED, thereby enhancing characteristics and reliability of the vertical LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertical LED, the method comprising:
   forming a light emission structure in which an n-type GaN layer an active layer, and a p-type GaN layer are sequentially laminated on a substrate;
   forming a p-electrode on the light emission structure;
   forming a structure support layer on the p-electrode;
   removing the substrate to - form an exposed N-polar surface of the n-type GaN layer,
   after removing the substrate, laser-treating the exposed N-polar surface of the n-type GaN layer to form a Ga layer and a Ga+N layer which are sequentially laminated from the laser-treated surface; and
   forming an n-electrode on the laser-treated exposed surface of the n-type GaN layer,
   wherein the laser-treating is performed by laser with a wavelength having energy larger than an energy band gap of GaN.

2. The method according to claim 1,
   wherein the n-electrode is formed of a single layer composed of one or more metals selected from the group consisting of Ti, Ta, and Zr.

3. The method according to claim 1,
   wherein the n-electrode has a multilayer form in which more than two layers including a layer composed of one or more metals selected from the group consisting of Ti, Ta, and Zr are laminated.

4. The method according to claim 1,
   wherein the p-electrode is formed of a conductive reflecting member.

5. The method according to claim 1, further comprising forming surface irregularities on the laser-treated surface of the n-type GaN layer, before the forming of the n-electrode.

6. The method according to claim 1, further comprising removing the Ga layer before the forming of the n-electrode.

* * * * *